(12) United States Patent
Kim et al.

(10) Patent No.: US 9,524,791 B1
(45) Date of Patent: Dec. 20, 2016

(54) DATA STORAGE DEVICE AND OPERATING METHOD THEREOF

(71) Applicant: SK hynix Inc., Gyeonggi-do (KR)

(72) Inventors: Kyung Bum Kim, Gyeonggi-do (KR); Yang Hyeon Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/964,774

(22) Filed: Dec. 10, 2015

(30) Foreign Application Priority Data

Sep. 4, 2015 (KR) .......................... 10-2015-0125588

(51) Int. Cl.
*G11C 11/34* (2006.01)
*G11C 16/30* (2006.01)
*G11C 11/56* (2006.01)

(52) U.S. Cl.
CPC ........... *G11C 16/30* (2013.01); *G11C 11/5635* (2013.01); *G11C 11/5642* (2013.01)

(58) Field of Classification Search
CPC ... G11C 16/30; G11C 11/5635; G11C 11/5642
USPC ............ 365/185.02, 185.03, 185.04, 185.11, 365/185.12, 185.18, 185.22, 189.011
See application file for complete search history.

(56) References Cited

U.S. PATENT DOCUMENTS

2009/0073762 A1* 3/2009 Lee ..................... G06F 11/1072
  365/185.03
2009/0313423 A1* 12/2009 Byeon ................. G11C 11/5621
  711/103

FOREIGN PATENT DOCUMENTS

KR        101456592        10/2014

* cited by examiner

*Primary Examiner* — Fernando Hidalgo
(74) *Attorney, Agent, or Firm* — IP & T Group LLP

(57) ABSTRACT

A method for operating a data storage device using, as a storage medium, a nonvolatile memory device including a memory cell array which is constructed by pages including data cells and flag cells for storing whether upper bit (MSB) data is stored in a data cell, includes searching a last programmed page in the case where recovery is made from a power failure to a normal state; determining whether the last programmed page is an upper bit (MSB) page to be accessed to store upper bit (MSB) data; and adjusting a flag cell read voltage for reading flag cells, in the case where the last programmed page is an upper bit (MSB) page.

18 Claims, 11 Drawing Sheets

DATA STORAGE DEVICE AND OPERATING METHOD THEREOF

CROSS-REFERENCES TO RELATED APPLICATION

The present application claims priority under 35 U.S.C. §119(a) to Korean application number 10-2015-0125588, filed on Sep. 4, 2015, in the Korean Intellectual Property Office, which is incorporated herein by reference in its entirety.

BACKGROUND

1. Technical Field

Various embodiments of the invention generally relate to a data storage device, and more particularly to data storage device, a data storage system and a method for improving reliability of an outage restoration operation.

2. Related Art

Recently, the paradigm for the computer environment has been converted into ubiquitous computing so that computer systems can be used anytime and anywhere. Due to this fact, the use of portable electronic devices such as mobile phones, digital cameras, and notebook computers has rapidly increased. In general, such portable electronic devices use a data storage device which uses a semiconductor memory device. The data storage device is used as an auxiliary memory device for portable electronic devices.

A data storage device employing a semiconductor memory device provides advantages in that, since there are no mechanical moving parts, stability and durability are excellent, information access speed is high and power consumption is small. Examples of data storage devices generally having such advantages include universal serial bus (USB) memory devices, memory cards having various interfaces, and solid state drives (SSD).

As portable electronic devices play a large file such as music file or video file, the data storage device is required to have a large storage capacity. The data storage device uses, as a storage medium, a memory device having a high integration degree for memory cells to secure a large storage capacity, for example, a flash memory device which is one of nonvolatile memory devices.

SUMMARY

Various embodiments of the present invention are directed to a data storage device having improved reliability at power failure recovery, and an operation method thereof.

In an embodiment, a data storage device may include: a nonvolatile memory device including a memory cell array which is constructed by pages including data cells and flag cells for storing whether upper bit (MSB) data is stored in a data cell; and a controller configured to control the nonvolatile memory device such that a read voltage for the flag cells is adjusted, in the case where recovery is made from a power failure to a normal state.

In an embodiment, a method for operating a data storage device using, as a storage medium, a nonvolatile memory device including a memory cell array which is constructed by pages including data cells and flag cells for storing whether upper bit (MSB) data is stored in a data cell, may include: searching a last programmed page in the case where recovery is made from a power failure to a normal state; determining whether the last programmed page is an upper bit (MSB) page to be accessed to store upper bit (MSB) data; and adjusting a flag cell read voltage for reading flag cells, in the case where the last programmed page is an upper bit (MSB) page.

According to the embodiments, reliability of an outage restoration operation may be improved.

DETAILED DESCRIPTION

Figure 1:
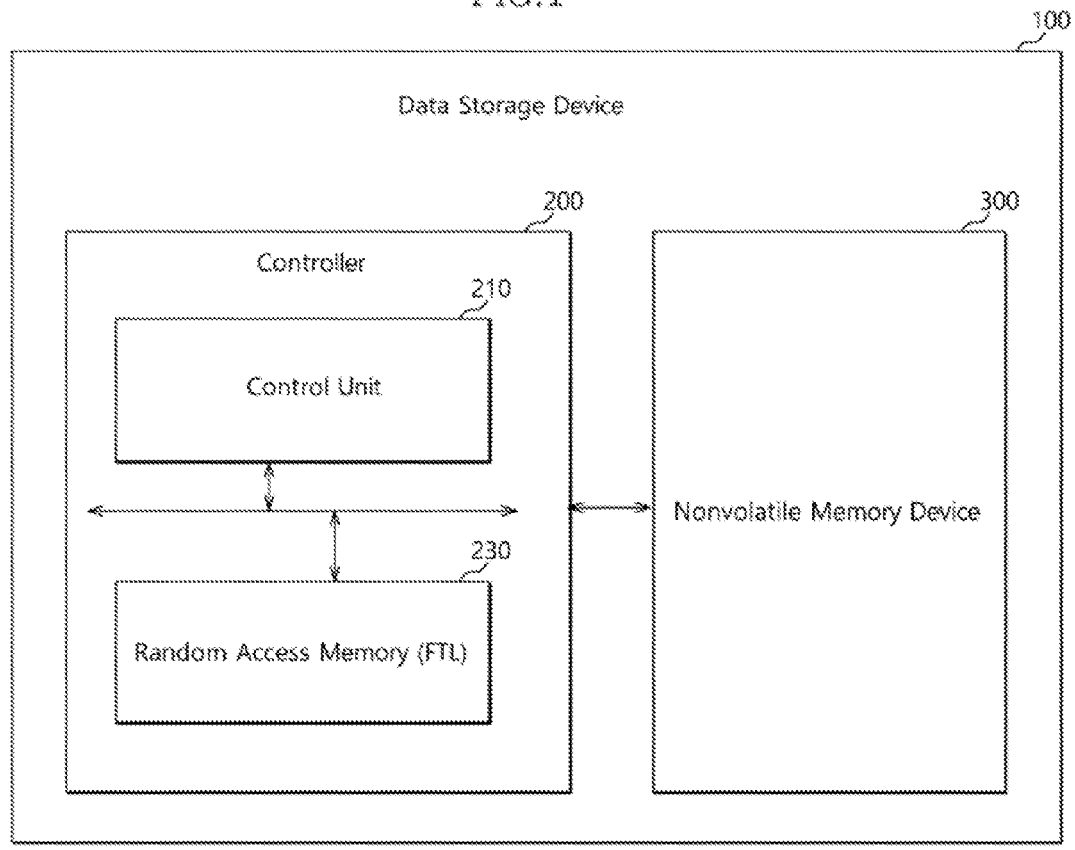
FIG. 1 is a block diagram illustrating a data storage device in accordance with an embodiment.

In the present invention, advantages, features and methods for achieving them will become more apparent after a reading of the following exemplary embodiments in relation with the drawings. The present invention may, however, be embodied in different forms and should not be construed as being limited to the embodiments set forth herein. Rather, these embodiments are provided to describe the present invention in sufficient detail to enable a person skilled in the art to which the invention pertains to practice technical concept of the present invention.

It is to be understood, therefore, that the present invention is not limited to the described embodiments and that the described embodiments are not limited to the particulars shown in the drawings. Moreover, the various features of the drawings are not necessarily drawn to scale and in some instances certain parts may have been exaggerated in relation to other parts in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "comprise", "include", "have" and/or any variations thereof when used in this specification, denote the presence of at least one or more stated features, steps, operations, and/or elements, but do not preclude the presence or addition of one or more other non-stated features, steps, operations, and/or elements thereof.

Hereinafter, a data storage device and an operating method thereof will be described below with reference to the accompanying drawings.

FIG. 1 is a block diagram illustrating a data storage device 100 according to an embodiment of the invention. The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be manufactured in any suitable form or package for interfacing with a host device. The data storage device 100 may be or form an integral part of a semiconductor memory device. The data storage device 100 may be manufactured or assembled as any one of various kinds of storage devices according to the protocol of an interface which is electrically coupled with the host device. For example, the data storage device 100 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured or assembled to any suitable form including various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a nonvolatile memory device 300. The nonvolatile memory device 300 may operate as the storage medium of the data storage device 100. The nonvolatile memory device 300 may be or comprise a NAND flash memory device. The nonvolatile memory device 300 may be or comprise a NOR flash memory device. The nonvolatile memory device 300 may be or comprise any one of other well-known various types of nonvolatile memory devices such as ferroelectric random access memory (FRAM) employing a ferroelectric capacitor, magnetic random access memory (MRAM) employing a tunneling magneto-resistive (TMR) layer, phase change random access memory (PRAM) employing a chalcogenide alloy, and a resistive random access memory (RERAN) employing a transition metal oxide, according to memory cells which construct a memory cell area.

The data storage device 100 may include a controller 200. The controller 200 may include a control unit 210 and a random access memory 230.

The control unit 210 may control the general operations of the controller 200. The control unit 210 may analyze and process a signal or a request provided from the host device. The control unit 210 may drive a firmware or a software loaded on the random access memory 230. The control unit 210 may be realized in the form of a hardware or in the combined form of a hardware and a software.

The random access memory 230 may store a firmware or a software to be driven by the control unit 210. Also, the random access memory 230 may store data necessary for the driving of the firmware or the software, for example, metadata. For example, the random access memory 230 may operate as a working memory of the control unit 210. The random access memory 230 may temporarily store data to be transmitted between the host device and the nonvolatile memory device 300. In other words, the random access memory 230 may operate as a data buffer memory or a data cache memory.

Figure 2:
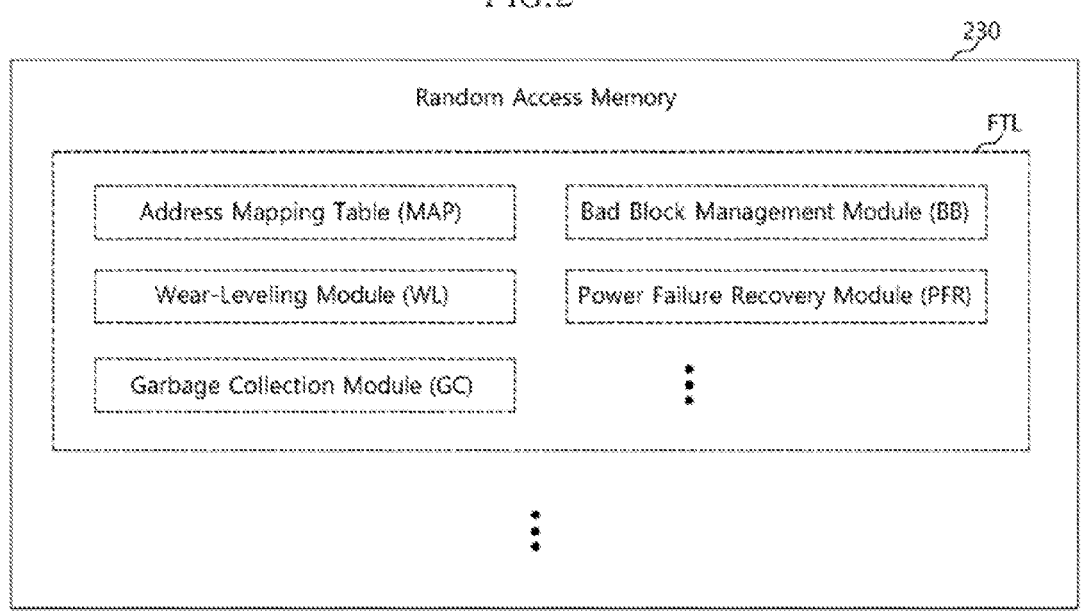
FIG. 2 is a diagram illustrating a firmware or a software to be driven in a working memory shown in FIG. 1.

FIG. 2 provides an example in diagrammatic form of a firmware or a software to be driven in the working memory shown in FIG. 1.

In the case where the nonvolatile memory device 300 is a NAND flash memory device, the control unit 210 may perform an erase operation on an entire memory block unit at a time, and may perform a read or program operation on a memory page at a time. The control unit 210 may perform an erase operation to memory cells before new data are to be stored.

The control unit 210 of the data storage device 100, which uses a flash memory device as a data storage medium, may drive a firmware or a software referred to as a flash translation layer FTL, in order to control an operation peculiar to the flash memory device and provide device compatibility to the host device. Through driving of such a flash translation layer FTL, the data storage device 100 may be recognized as a general data storage device such as a hard disk by the host device.

The flash translation layer FTL may be loaded on the random access memory 230. The flash translation layer FTL may be configured to comprise one or more modules for performing various functions and accommodating metadata as may be needed for driving of the modules. For example, referring to FIG. 2, the flash translation layer FTL may include an address mapping table MAP, a wear-leveling module WL, a garbage collection module GC, a bad block management module BB, and a power failure recovery module PFR. Other modules may also be used as may be needed.

A host device may access the data storage device 100, for example, to request a read operation or a write operation. The host device may provide a logical address to the data storage device 100. The flash translation layer FTL may then translate the provided logical address into a physical address of the nonvolatile memory device 300, and perform a requested operation by referring to the converted physical address. To facilitate, the address translation operation, address translation data, such as, for example, an address mapping table MAP may be included in the flash translation layer FTL, as shown in FIG. 2.

The wear-leveling module WL may manage wear for the memory blocks of the nonvolatile memory device 300. Memory cells of the nonvolatile memory device 300 may be aged by program and erase operations. Aged memory cells, that is, worn-out memory cells may cause fails (for example, physical defects). The wear-leveling module WL may manage the program-erase counts of respective memory blocks to prevent certain memory blocks become worn out earlier than other memory blocks. For example, the wear-leveling module WL module may manage the program-erase counts to distribute them evenly throughout the memory blocks.

The garbage collection module GC may manage memory blocks where fragmented data are stored. In the case where the nonvolatile memory device 300 is a flash memory device, for which it may not be possible or desirable to perform an overwrite operation, a unit of erase (i.e., a memory block) may be larger than a unit of program (i.e., a memory page). Hence, the nonvolatile memory device 300 may be configured to perform an operation of collecting valid data dispersed at physically different positions when a storage space reaches a limit. The garbage collection module GC may perform an operation of collecting valid data that are fragmented due to plurality of write and/or erase operations, to a single collection area.

The bad block management module BB may manage a memory block in which a fail has occurred, among the memory blocks of the nonvolatile memory device 300. As described above, a fail such as, for example, a physical defect, may occur in a worn out memory cell. Data stored in a failed memory cell may not be normally read out. Moreover, data may not be normally stored in a failed memory cell. The bad block management module BB may manage a memory block including a failed memory cell, in such a way as to disable use of the failed memory cell. The bad block management module BB may disable the use of one or more failed memory cells. The bad block management module BB may disable the use of an entire memory block containing one or more memory blocks. Disabling only the failed one or more memory cells without disabling the entire memory block containing the one or more failed memory cells may be advantageous as it may allow use of the remaining non-failed memory cells of the memory block.

When power supplied to the data storage device 100 is abruptly cut off in the course of a program operation to memory cells of the nonvolatile memory device 300, the program operation may not normally be completed. The power failure recovery module PFR may manage an error of a memory cell, a page or a memory block to which the program operation is interrupted due to a power failure when power is re-established to the data storage device 100. An example of a power failure recovery operation of the power failure recovery module PFR will be described below for example with reference to FIGS. 3 and 4.

Figure 3:
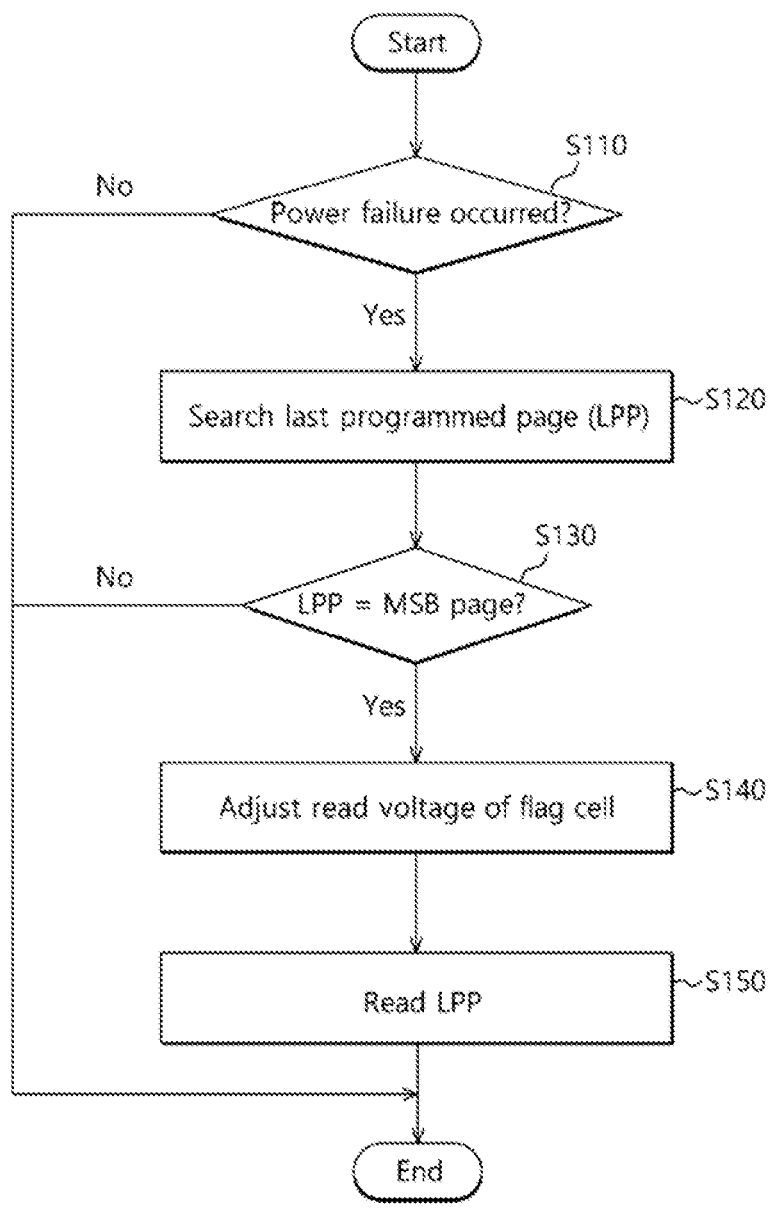
FIG. 3 is a flow chart illustrating a method for operating a power failure recovery module in accordance with an embodiment.
Figure 4:
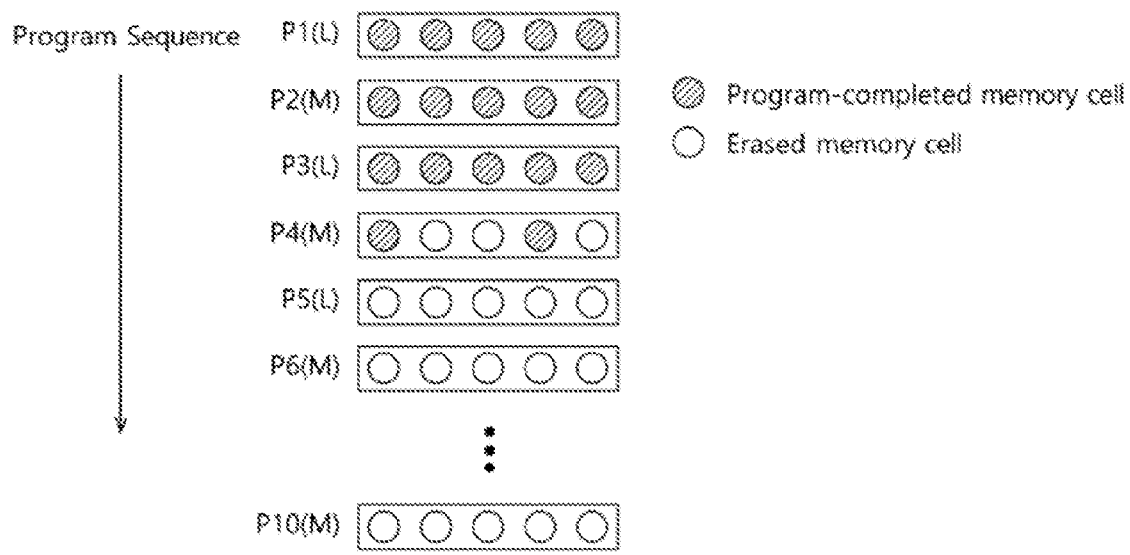
FIG. 4 is a diagram of example states of pages illustrating the operation of the power failure recovery module.

FIG. 3 is a flow chart illustrating a method for operating a power failure recovery module according to an embodiment of the invention. FIG. 4 is a diagram illustrating an example of states of memory pages of a nonvolatile memory device the operation of the power failure recovery module. For simplicity, only 10 pages P1 to P10 each including 5 memory cells will be described as an example. It is assumed that the pages P1 to P10 are programmed in ascending order.

At step S110, the power failure recovery module PFR may determine whether a power failure has occurred. If no power failure has occurred, the operation of the power failure recovery module PFR may be ended. Conversely, if power failure has occurred, the power failure recovery module PFR may perform a power failure recovery operation including steps S120 to S150.

At step S120, the power failure recovery module PFR may search a last programmed page LPP. As noted earlier, in order to store new data in memory cells, an erase operation should first be performed to the memory cells. This means that memory cells in an erased state are not programmed yet. The power failure recovery module PFR may search the last programmed page LPP by employing a method of searching for an erased page.

Referring to FIG. 4, for example, the power failure recovery module PFR may read the pages P1 to P10 according to the program sequence (e.g., in an ascending order), search for locating any erased pages and detect that the pages P5 to P10 are erased pages. The power failure recovery module PFR may then determine that page P4, i.e. the page programmed before the erased page P5 in the program sequence, is the last programmed page LPP. The last programmed page P4 may be a program-completed page. Conversely, as shown in FIG. 4, the last programmed page P4 may be a program-interrupted page including a memory cell to which the program operation is not completed due to a power failure.

At step S130, the power failure recovery module PFR may determine whether the last programmed page LPP is a most significant bit (MSB) page. As shown in FIG. 4, the pages P1 to P10 may be divided into least significant bit (LSB) pages ("L") which are to be accessed to store LSB data and MSB pages ("M") which are to be accessed to store MSB data.

In the case where the last programmed page LPP is an LSB page L, the operation of the power failure recovery module PFR may be ended. Conversely, in the case where the last programmed page LPP is an MSB page M, the power failure recovery module PFR at step S140 may adjust a voltage for reading flag cells which are referred to when the MSB page M is read out (hereinafter, referred to as a "flag cell read voltage").

The power failure recovery module PFR may control the nonvolatile memory device 300 to adjust the flag cell read voltage as may be needed. For example, the power failure recovery module PFR may provide a voltage adjustment command, which controls the nonvolatile memory device 300 to adjust the flag cell read voltage, to the nonvolatile memory device 300. The power failure recovery module PFR may determine a level of the flag cell read voltage, and provide the determined level of the flag cell read voltage to the nonvolatile memory device 300.

The power failure recovery module PFR may read the last programmed page LPP at step S150. An example of the read operation of the nonvolatile memory device 300 to the last programmed page LPP under the control of the power failure recovery module PFR will be described below in more detail with reference to FIGS. 5 to 8.

Figure 5:
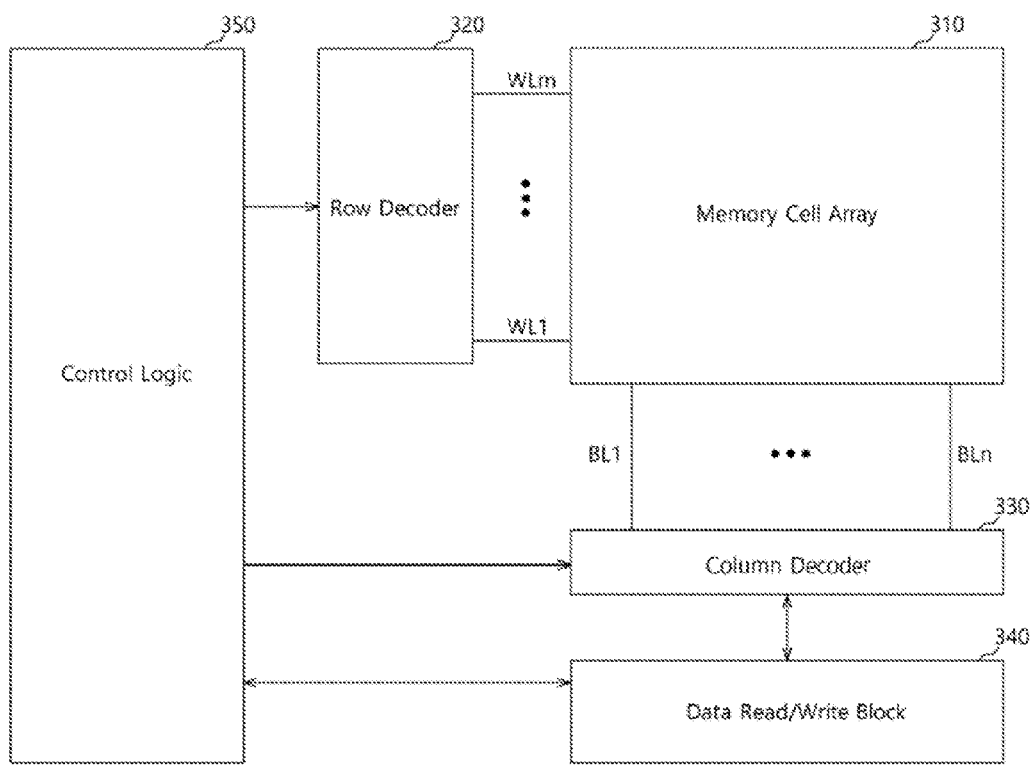
FIG. 5 is a block diagram illustrating a nonvolatile memory device in accordance with an embodiment.

FIG. 5 is a block diagram illustrating a nonvolatile memory device according to an embodiment of the invention. Referring to FIG. 5, the nonvolatile memory device 300 may include a memory cell array 310, a row decoder 320, a column decoder 330, a data read/write block 340, and a control logic module 350.

The memory cell array 310 may include memory cells arranged at areas where word lines WL1 to WLm and bit lines BL1 to BLn cross each other. The memory cells may be grouped by an access unit as memory blocks or pages depending upon the operation taking place. For example the memory cells may be grouped by an access unit, such as a memory block as an erase unit and a page as a program and read unit.

The row decoder 320 may be coupled with the memory cell array 310 through one or more word lines WL1 to WLm. The row decoder 320 may operate under the control of the control logic 350. The row decoder 320 may decode an address provided from the controller 200. The row decoder 320 may select and drive the word lines WL1 to WLm, based on a decoding result. For instance, the row decoder 320 may provide a word line driving voltage provided from a voltage generator (not shown), to the word lines WL1 to WLm.

The column decoder 330 may be coupled with the memory cell array 310 through one or more bit lines BL1 to BLn. The column decoder 330 may operate according to the control of the control logic 350. The column decoder 330 may decode an address provided from the controller 200. The column decoder 330 may couple the bit lines BL1 to BLn with read/write circuits of the data read/write block 340 which respectively correspond to the bit lines BL1 to BLn, based on a decoding result. Also, the column decoder 330 may drive the bit lines BL1 to BLn, based on the decoding result.

The data read/write block 340 may operate according to the control of the control logic 350. The data read/write block 340 may operate as a write driver or a signal amplifier according to an operation mode. For example, the data read/write block 340 may operate as a write driver which stores data provided from the controller 200, in the memory cell array 310 in a write operation. For another example, the data read/write block 340 may operate as a signal amplifier which reads out data from the memory cell array 310 in a read operation.

The control logic 350 may control general operations of the nonvolatile memory device 300, based on control signals provided from the controller 200. For example, the control logic 350 may control main operations of the nonvolatile memory device 300 such as read, write and erase operations of the nonvolatile memory device 300.

When the voltage adjustment command for adjusting the flag cell read voltage is provided from the controller 200, the control logic 350 may control related blocks, for example, the voltage generator and the row decoder 320, such that a flag cell read voltage different from an original flag cell read voltage is applied.

Figure 6:
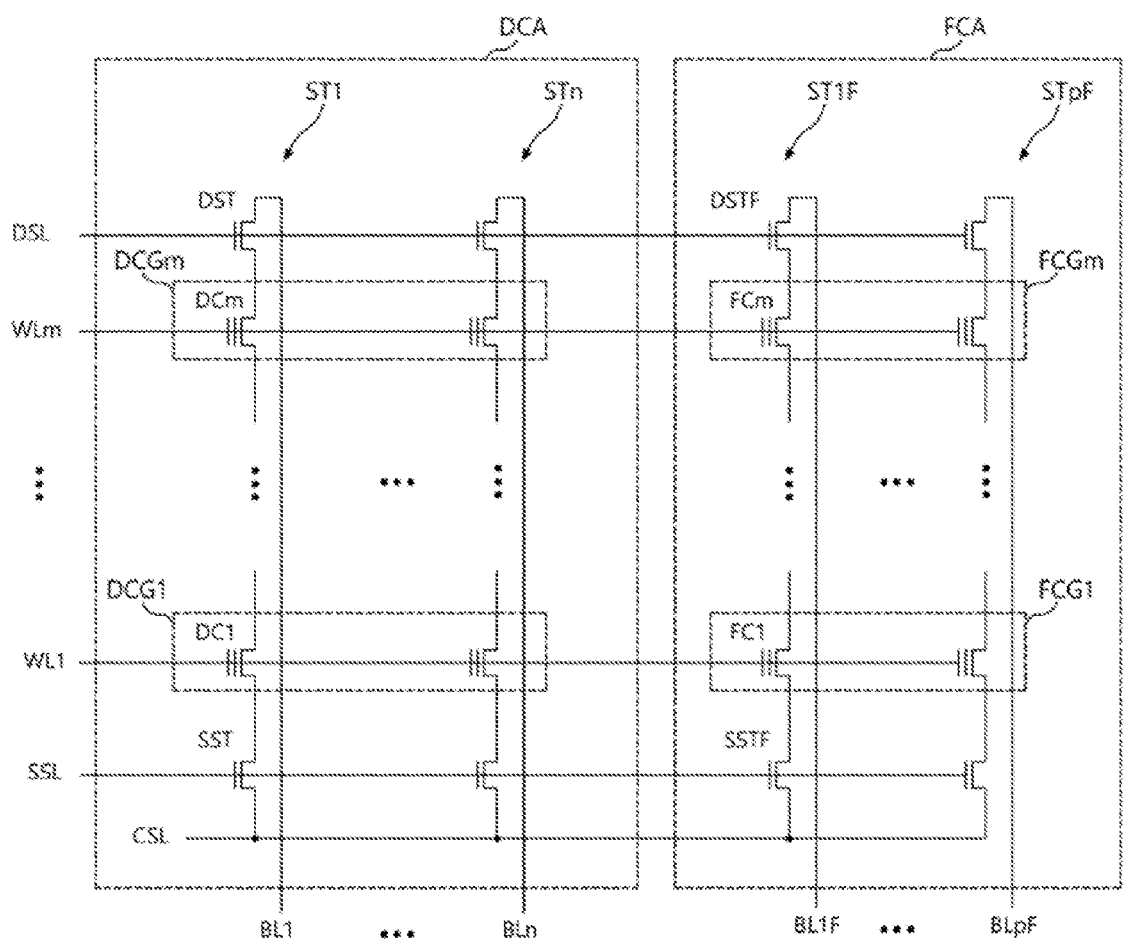
FIG. 6 is a circuit diagram illustrating a memory block of the nonvolatile memory device in accordance with the embodiment.

FIG. 6 is a circuit diagram illustrating an example of a memory block BLK of the nonvolatile memory device according to an embodiment of the present invention. The memory cell array 310 of the nonvolatile memory device 300 shown in FIG. 5 may include a plurality of memory blocks. Each of the plurality of memory blocks may, for example, be the same as the memory block BLK shown in FIG. 6.

The memory block BLK may include a data cell area DCA and a flag cell area FCA. The data cell area DCA may store data provided from the controller 200. Although not shown, the data cell area DCA may include a main area and a spare area. For example, data provided from the host device may be stored in the main area. The spare area may store information related with the data stored in the main area, for example, metadata such as error correction codes.

The data cell area DCA may include a plurality of cell strings ST1 to STn which are coupled to the plurality of bit lines BL1 to BLn, respectively. The cell strings ST1 to STn may have the same configuration, hence for avoiding unnecessary repetition, only one cell string ST1 is described below.

The cell string ST1 may, for example, include a plurality of data cells DC1 to DCm and select transistors DST and SST which are coupled between the bit line BL1 and a common source line CSL. For example the cell string ST1 may include a drain select transistor DST which is coupled to a drain select line DSL, the plurality of data cells DC1 to DCm which are respectively coupled to the plurality of word lines WL1 to WLm, and a source select transistor SST which is coupled to a source select line SSL.

The flag cell area FCA may include a plurality of flag cell strings ST1F to STpF which are coupled to a plurality of flag bit lines BL1F to BLpF, respectively. The flag cell strings ST1F to STpF may have the same configuration, hence for avoiding unnecessary repetition, only one flag cell string ST1F is described below.

The flag cell string ST1F may include a plurality of flag cells FC1 to FCm and select transistors DSTF and SSTF which are coupled between the flag bit line BL1F and the common source line CSL. For example, the flag cell string ST1F may include a drain select transistor DSTF which is coupled to the drain select line DSL, the plurality of flag cells FC1 to FCm which are respectively coupled to the plurality of word lines WL1 to WLm, and a source select transistor SSTF which is coupled to the source select line SSL.

The flag cells of the flag cell area FCA may be used as storage elements for storing information representing whether the MSB data is programmed in any memory cells of the corresponding data cell area DCA. The flag cell area FCA may be a hidden area, access to which may be restricted, unlike the data cell area DCA for storing data provided from a host device.

The flag cell area FCA is described in further detail by taking as a representative example a first data cell group DCG1 of the data cell area DCA and a first flag cell group FCG1 corresponding thereto.

Figure 7:
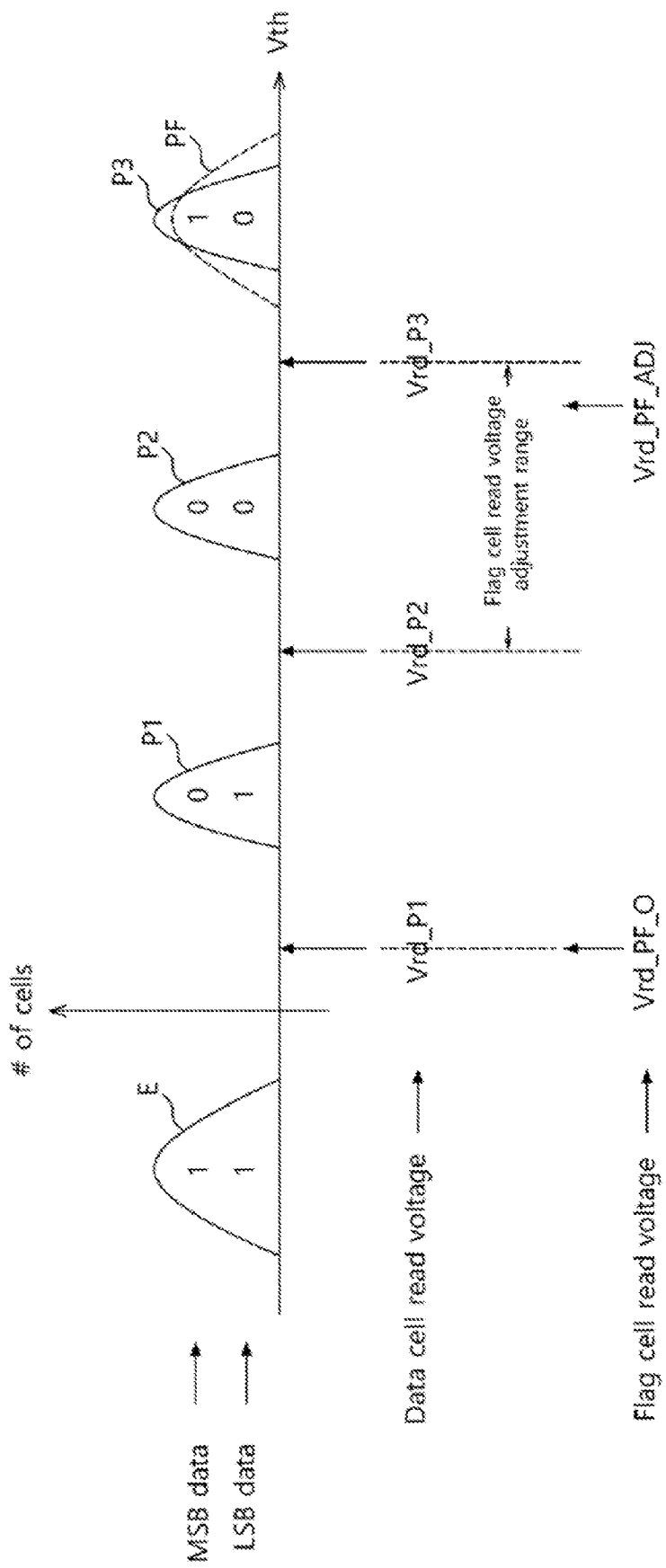
FIG. 7 is a diagram illustrating read voltages in accordance with the embodiment.

Each of memory cells of the first data cell group DCG1 may store one or more data bits. Preferably, each memory cell may store a plurality of data bits. A memory cell capable of storing two or more data bits is referred to as a multi-level cell (MLC). For instance, as shown in FIG. 7, each 2-bit multi-level cell (MLC) may be erased to have an erased state E and may be programmed to have a threshold voltage corresponding to one or more of a plurality programmed states P1, P2 and P3, according to multi-bit data.

In the case where each of the memory cells of the first data cell group DCG1 stores 2-bit data, an upper bit data or the MSB data and a lower bit data or the LSB data may be programmed in each of the memory cells. When the MSB data is programmed in any one of the memory cells of the first data cell group DCG1, all flag cells of the corresponding first flag cell group FCG1 may be programmed. At this time, each of the flag cells of the first flag cell group FCG1 may be programmed to have a threshold voltage corresponding to a flag-programmed state PF as shown in FIG. 7.

A program operation for the first flag cell group FCG1 may be performed while a program operation for the corresponding first data cell group DCG1 is performed. The program operation for the first flag cell group FCG1 may be completed before the program operation for the corresponding first data cell group DCG1 is completed.

The status of the first flag cell group FCG1 may determine whether to perform the MSB read operation for the first data cell group DCG1. For example, when it is determined that the flag cells of the first flag cell group FCG1 are programmed, the MSB read operation for the memory cells of the first data cell group DCG1 may be normally performed. Conversely, when it is determined that the flag cells of the first flag cell group FCG1 are not programmed, the MSB read operation for the memory cells of the first data cell group DCG1 may not be performed.

Some or all of the Data stored in the flag cell of the first flag cell group FCG1 may be changed or corrupted for various reasons. Therefore, the flag cells of the first flag cell group FCG1 may be read through an error correction operation. An example of such error correction operation may include, using a majority check method. According to the majority check method, even though different data are stored in the flag cells of the first flag cell group FCG1, a majority between stored data may be determined as representative data stored in the first flag cell group FCG1.

FIG. 7 illustrates a threshold voltage distribution of data cells comprising 2-bit multi-level cells, a threshold voltage distribution of flag cells, and read voltages.

A 2-bit multi-level cell may be erased to have a threshold voltage corresponding to the erased state E and be programmed to have a threshold voltage corresponding to any one of the plurality of programmed states P1, P2 and P3 according to multiple bit data, that is, LSB data and MSB data.

During a read operation to data cells, any one of a first read voltage Vrd_P1 having a voltage level between the erased state E and the first programmed state P1, a second read voltage Vrd_P2 having a voltage level between the first programmed state P1 and the second programmed state P2, and a third read voltage Vrd_P3 having a voltage level between the second programmed state P2 and the third programmed state P3 may be applied to the data cells.

When the second read voltage Vrd_P2 is applied, data cells having threshold voltages of the erased state E and the first programmed state P1 may be determined as "on-cells" which store LSB data of "1," and data cells having threshold voltages of the second programmed state P2 and the third programmed state P3 may be determined as "off-cells" which store LSB data of "0."

When the first read voltage Vrd_P1 is applied, a data cell having a threshold voltage of the erased state E may be determined as the "on-cell" which stores MSB data of "1," and a data cell having a threshold voltage of the first programmed state P1 may be determined as the "off-cell" which stores MSB data of "0."

When the third read voltage Vrd_P3 is applied, a data cell having a threshold voltage of the second programmed state P2 may be determined as the "on-cell" which stores MSB data of "0," and a data cell having a threshold voltage of the third programmed state P3 may be determined as the "off-cell" which stores MSB data of "1."

Each flag cell may be erased to have a threshold voltage corresponding to the erased state E, and be programmed to have a threshold voltage corresponding to the flag-programmed state PF. During a read operation to flag cells, a flag cell read voltage Vrd_PF_O or Vrd_PF_ADJ having a voltage level between the erased state E and the flag-programmed state PF may be applied to the flag cells.

During the read operation, the flag cell read voltage Vrd_PF_O or Vrd_PF_ADJ having a voltage level between the erased state E and the flag programmed state PF may be applied to flag cells. When the flag cell read voltage Vrd_PF_O or Vrd_PF_ADJ is applied, a flag cell having a threshold voltage of the erased state E may be determined as the "on-cell" which stores data "1," and a flag cell having a threshold voltage of the flag programmed state PF may be determined as the "off-cell" which stores data "0."

For example, during a normal read operation, an original flag cell read voltage Vrd_PF_O may be applied to flag cells. The original flag cell read voltage Vrd_PF_O may have the same voltage level as the first read voltage Vrd_P1.

For another example, as described above with reference to FIG. 2, the power failure recovery module PFR may provide a voltage adjustment command for controlling the nonvolatile memory device 300 to adjust the flag cell read voltage, and the nonvolatile memory device 300 may perform a read operation according to the control of the power failure recovery module PFR. In the case where a read operation is performed under the control of the power failure recovery module PFR, an adjusted flag cell read voltage Vrd_PF_ADJ may be applied to flag cells.

The adjusted flag cell read voltage Vrd_PF_ADJ may have a voltage level between the second read voltage Vrd_P2 and the third read voltage Vrd_P3. For instance, the adjusted flag cell read voltage Vrd_PF_ADJ may be the same voltage as the third read voltage Vrd_P3 for reading the programmed state P3 having a highest threshold voltage among the programmed states P1, P2 and P3 of the data cells.

Figure 8:
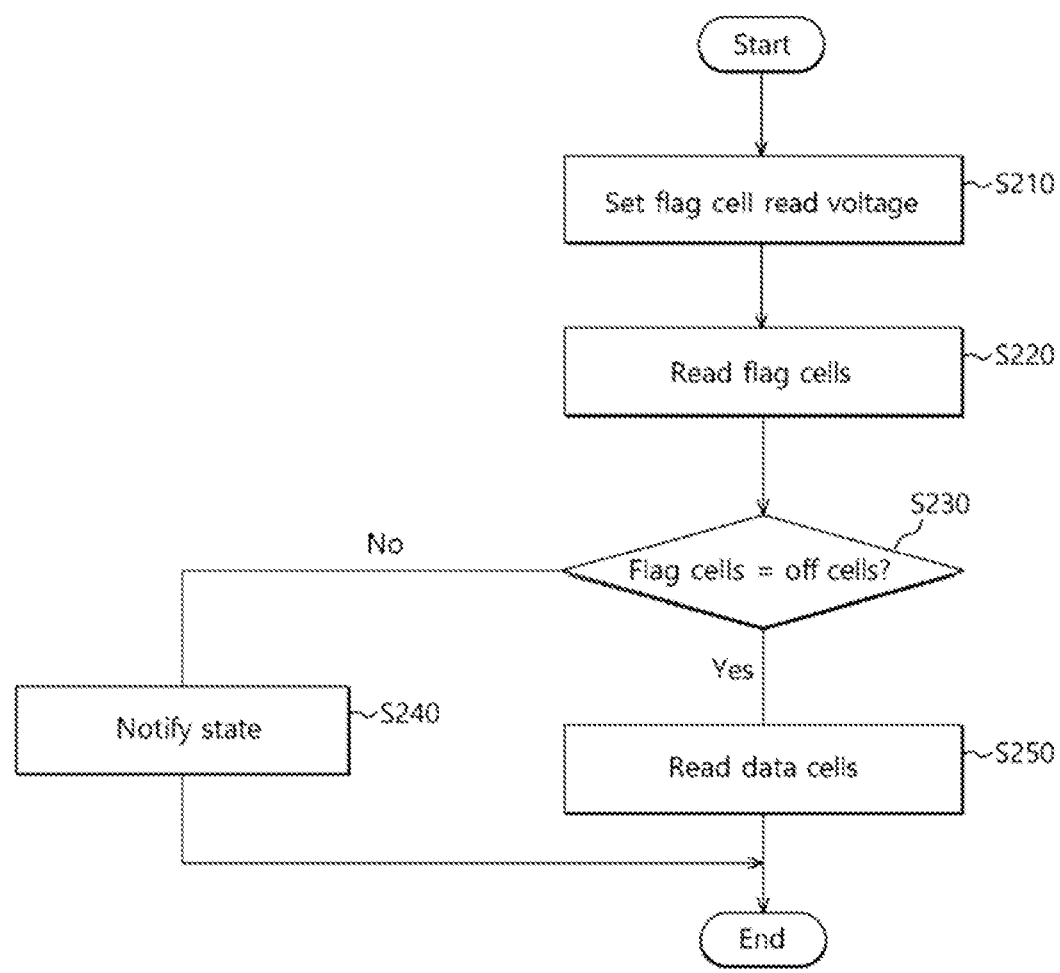
FIG. 8 is a flow chart illustrating a method for operating a nonvolatile memory device in accordance with an embodiment.

FIG. 8 is a flow chart illustrating an example of a method for operating the nonvolatile memory device 300 according to an embodiment of the invention. FIG. 8 shows a read operation of the nonvolatile memory device 300 to the last programmed page LPP under the control of the power failure recovery module PFR performing the operation as described with reference to FIGS. 3 and 4.

Referring to FIG. 8, at step S210, the control logic 350 may set a flag cell read voltage in response to a voltage adjustment command for adjusting the flag cell read voltage provided from the power failure recovery module PFR as described with reference to step S140 of FIG. 3. For example, as described above with reference to FIG. 7, the control logic 350 may control the voltage regulator and the row decoder 320 such that a flag cell read voltage may be adjusted from the original flag cell read voltage Vrd_PF_O to the adjusted flag cell read voltage Vrd_PF_ADJ. For another example, in the case where the level of the flag cell read voltage is provided from the power failure recovery module PFR, the control logic 350 may control the voltage regulator and the row decoder 320 to adjust the flag cell read voltage to the provided level of the flag cell read voltage.

At step S220, the control logic 350 may read flag cells or a flag cell group corresponding to the last programmed page LPP in the nonvolatile memory device 300. To this end, the control logic module 350 may control the row decoder 320, the column decoder 330 and the data read/write block 340.

At step S230, the control logic 350 may determine whether the flag cells corresponding to the last programmed page LPP are the "off-cells" based on data read at step S220 according to the adjusted flag cell read voltage Vrd_PF_ADJ. For example, the control logic 350 may determine whether the flag cells corresponding to the last programmed page LPP stores data "0" according to the adjusted flag cell read voltage Vrd_PF_ADJ.

When the flag cells are determined as the "off-cells" storing data "0" according to the adjusted flag cell read voltage Vrd_PF_ADJ, the flag cell may represent that the corresponding last programmed page is the MSB page or that the program operation to the corresponding last programmed page LPP is completed without interruption despite of the power failure.

When the flag cells are determined as the "on-cells" storing data "1" according to the adjusted flag cell read voltage Vrd_PF_ADJ, the flag cell may represent that the corresponding last programmed page is not the MSB page or that the program operation to the corresponding last programmed page is interrupted due to the power failure even though the power failure recovery module PFR determines the last programmed page LPP to be the MSB page according to the original flag cell read voltage Vrd_PF_O at step S130 as described with reference to FIG. 3.

When the flag cells are not determined as the "off-cells" according to the adjusted flag cell read voltage Vrd_PF_ADJ, it may be determined that the program operation to the corresponding last programmed page LPP, which is determined as the MSB page according to the original flag cell read voltage Vrd_PF_O at step S130 as described with reference to FIG. 3, is interrupted due to the power failure and thus the program operation to the flag cells and the corresponding last programmed page LPP is not completed. Thus, when the flag cells are not determined as the "off-cells", the control logic 350 may notify a state for the read operation, to the controller 200 at step S240 as a response to the step S150 described with reference to FIG. 3.

When the flag cells are determined as the "off-cells" according to the adjusted flag cell read voltage Vrd_PF_ADJ, it may be determined that the program operation to the corresponding last programmed page LPP, which is determined as the MSB page according to the original flag cell read voltage Vrd_PF_O at step S130 as described with reference to FIG. 3, is not interrupted and thus the program operation to the flag cells and the corresponding last programmed page LPP is completed even though the power failure. Thus, in the case where the flag cells are determined as the "off-cells", the control logic 350 may read the last programmed page LPP corresponding to the flag cells at step S250 as a response to the step S150 described with reference to FIG. 3. To this end, the control logic 350 may control the row decoder 320, the column decoder 330 and the data read/write block 340.

Figure 9:
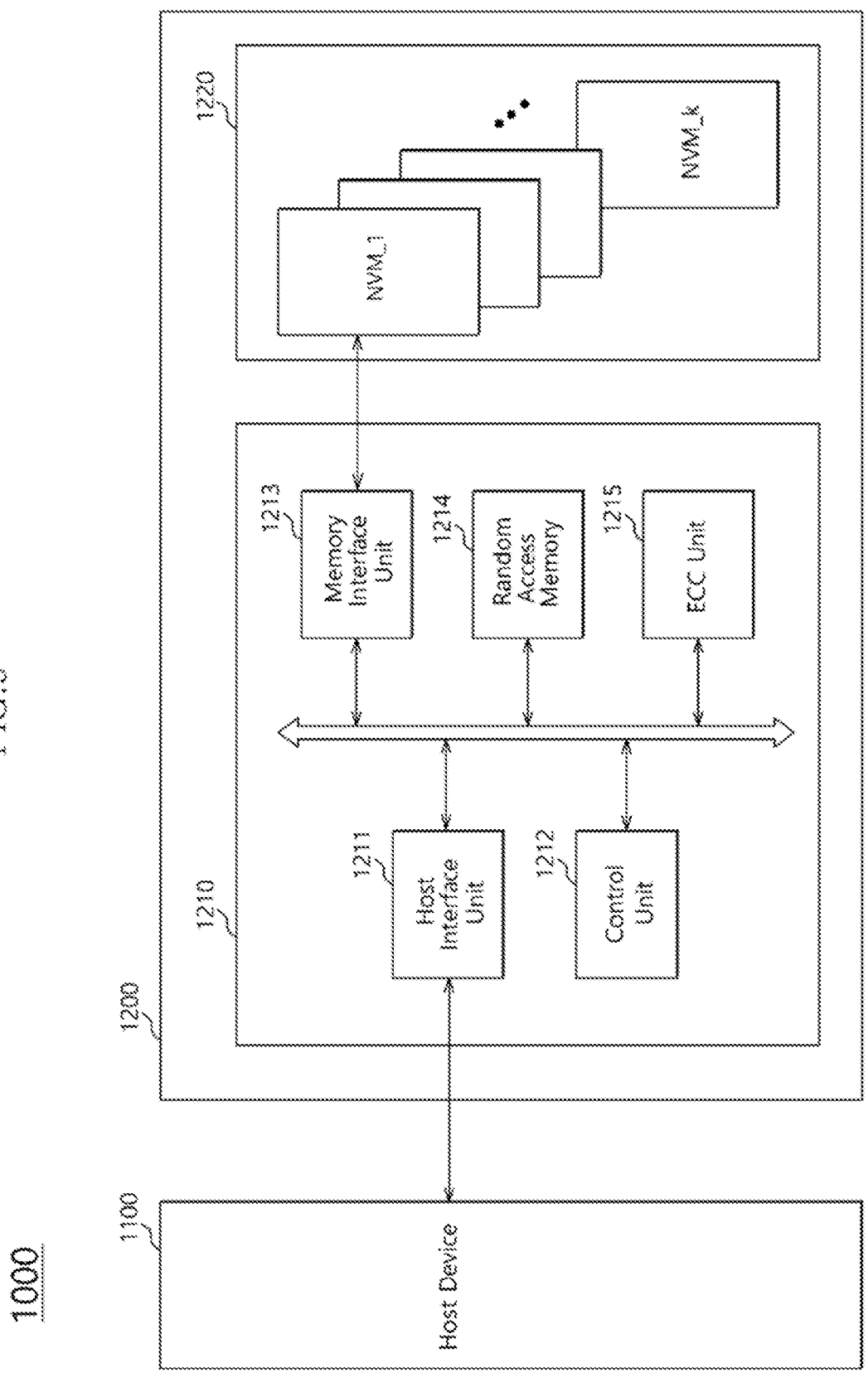
FIG. 9 is a block diagram illustrating a data processing system including the data storage device in accordance with an embodiment.

FIG. 9 is a block diagram illustrating a data processing system including a data storage device according to an embodiment of the invention.

A data processing system 1000 may include a host device 1100 and a data storage device 1200. The data storage device 1200 may include a controller 1210 and a nonvolatile memory device 1220. The data storage device 1200 may be used by being coupled to the host device 1100 such as a mobile phone, an MP3 player, a laptop computer, a desktop computer, a game player, a TV, an in-vehicle infotainment system, and so forth.

The controller 1210 may include a host interface unit 1211, a control unit 1212, a memory interface unit 1213, a random access memory 1214, and an error correction code (ECC) unit 1215.

The control unit 1212 may control the general operations of the controller 1210 in response to a request from the host device 1100. The control unit 1212 may drive a firmware or a software for controlling the nonvolatile memory device 1220. The control unit 1212 may perform the flag cell read voltage control operation described above with reference to FIG. 3.

The random access memory 1214 may be used as a working memory of the control unit 1212. The random access memory 1214 may be used as a buffer memory which temporarily stores the data read from the nonvolatile memory device 1220 or the data provided from the host device 1100.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, and a serial attached SCSI (SAS) protocol.

The memory interface unit 1213 may interface the controller 1210 and the nonvolatile memory device 1220. The memory interface unit 1213 may provide commands and addresses to the nonvolatile memory device 1220. Furthermore, the memory interface unit 1213 may exchange data with the nonvolatile memory device 1220.

The error correction code unit 1215 may detect an error of the data read from the nonvolatile memory device 1220. Also, the error correction code unit 1215 may be configured to correct the detected error when the detected error is within a correctable range.

The nonvolatile memory device 1220 may be used as the storage medium of the data storage device 1200. The nonvolatile memory device 1220 may include a plurality of nonvolatile memory chips (or dies) NVM_1 to NVM_k. Each of the nonvolatile memory chips (or dies) NVM_1 to NVM_k may perform the read operation employing a controlled flag cell read voltage as described above with reference to FIG. 8.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a personal computer memory card international association (PCMCIA) card, a compact flash (CF) card, a smart media card, a memory stick, and so forth.

Figure 10:
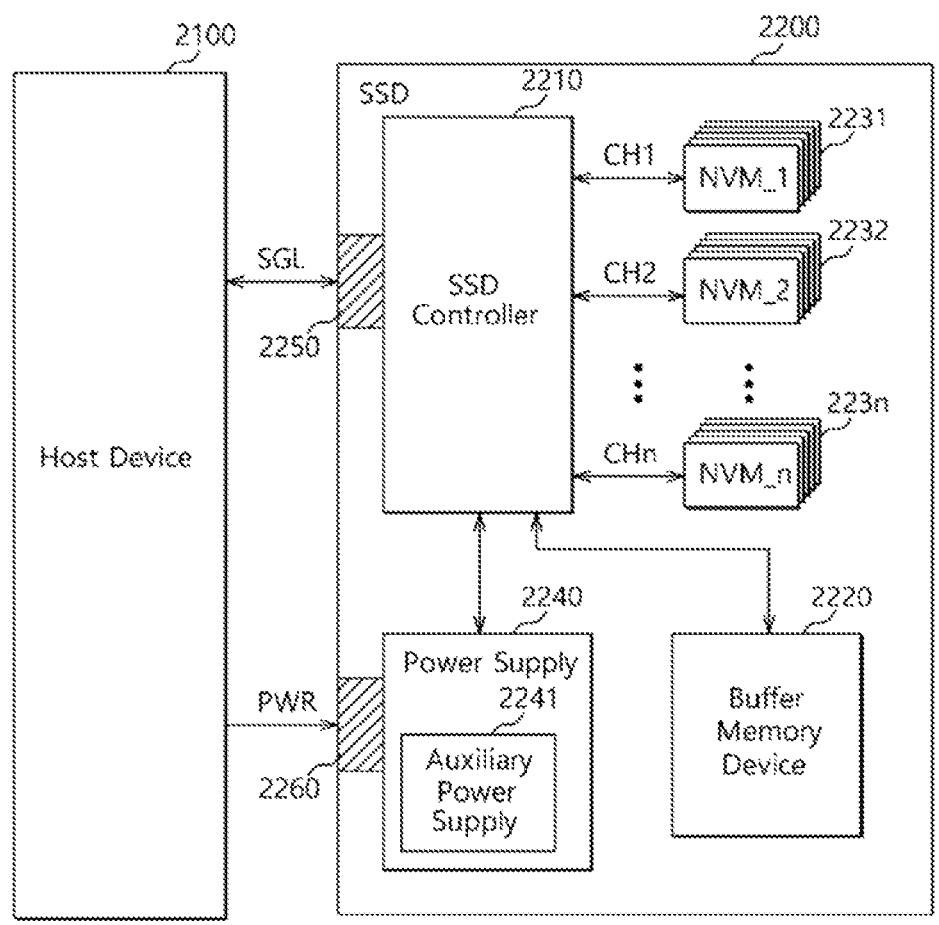
FIG. 10 is a block diagram illustrating a data processing system including a solid state drive (SSD) in accordance with an embodiment.

FIG. 10 is a block diagram illustrating a data processing system including a solid state drive (SSD) in accordance with an embodiment.

A data processing system 2000 may include a host device 2100 and a solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100. The SSD controller 2210 may perform the flag cell read voltage control operation described above with reference to FIG. 3.

The buffer memory device 2220 may temporarily store data which are to be stored in the nonvolatile memory devices 2231 to 223n. Further, the buffer memory device 2220 may temporarily store data which are read from the nonvolatile memory devices 2231 to 223n. The data temporarily stored in the buffer memory device 2220 may be transmitted to the host device 2100 or the nonvolatile memory devices 2231 to 223n under the control of the SSD controller 2210.

The nonvolatile memory devices 2231 to 223n may be used as storage media of the SSD 2200. Each of the nonvolatile devices 2231 to 223n may perform the read operation employing a controlled flag cell read voltage described above with reference to FIG. 8. The nonvolatile memory devices 2231 to 223n may be coupled with the SSD controller 2210 through a plurality of channels CH1 to CHn, respectively. One or more nonvolatile memory devices may be coupled to one channel. The nonvolatile memory devices coupled to one channel may be coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power so as to allow the SSD 2200 to be normally terminated when a sudden power-off occurs. The auxiliary power supply 2241 may include super capacitors capable of being charged with power PWR.

The SSD controller 2210 may exchange a signal SGL with the host device 2100 through the signal connector 2250. The signal SGL may include a command, an address, data, and so forth. The signal connector 2250 may by configured by a connector such as of parallel advanced technology attachment (PATA), serial advanced technology attachment (SATA), small computer system interface (SCSI), serial attached SCSI (SAS), peripheral component interconnection (PCI) and PCI express (PCI-E) protocols, according to the interface scheme between the host device 2100 and the SSD 2200.

Figure 11:
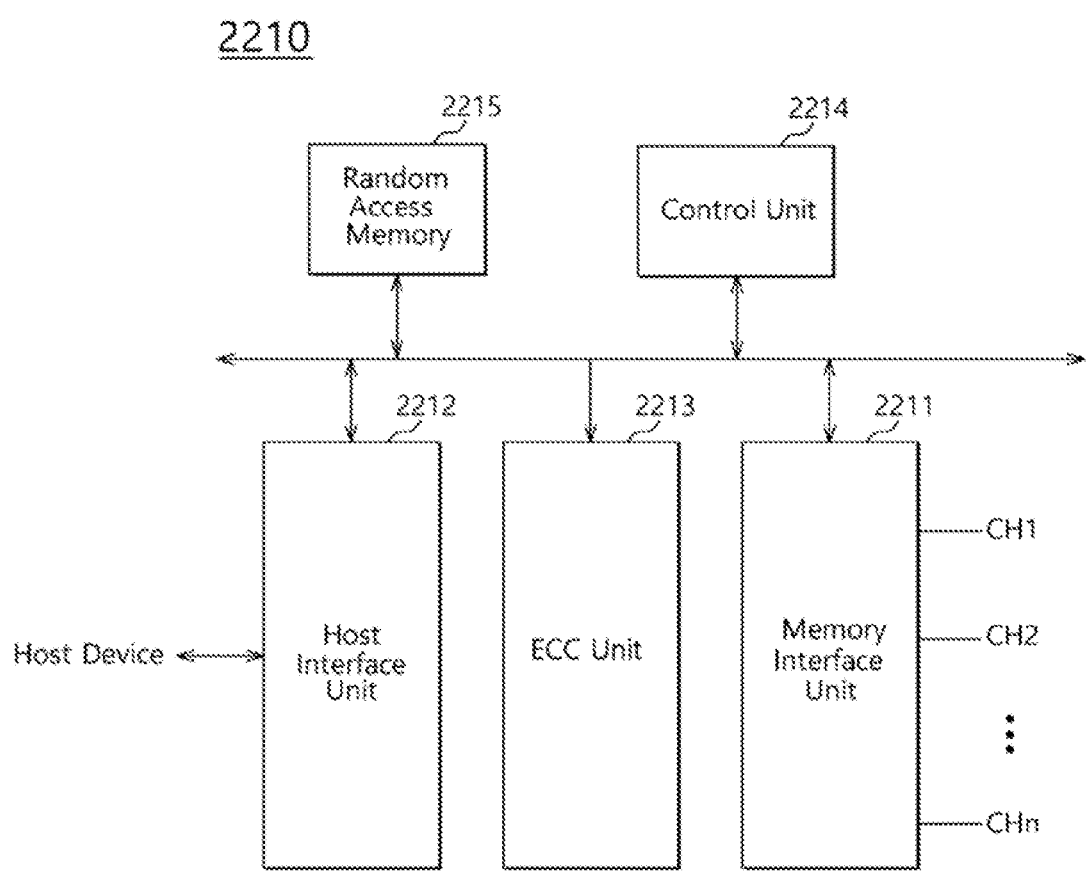
FIG. 11 is a block diagram illustrating an example of the SSD controller, according to an embodiment of the invention.

FIG. 11 is a block diagram illustrating the SSD controller shown in FIG. 10. Referring to FIG. 11, the SSD controller 2210 may include a memory interface unit 2211, a host interface unit 2212, an error correction code (ECC) unit 2213, a control unit 2214, and a random access memory 2215.

The memory interface unit 2211 may provide a control signal such as a command and an address to the nonvolatile memory devices 2231 to 223n. Moreover, the memory interface unit 2211 may exchange data with the nonvolatile memory devices 2231 to 223n. The memory interface unit 2211 may scatter the data transmitted from the buffer memory device 2220 to the respective channels CH1 to CHn, under the control of the control unit 2214. Furthermore, the memory interface unit 2211 may transmit the data read from the nonvolatile memory devices 2231 to 223n to the buffer memory device 2220, under the control of the control unit 2214.

The host interface unit 2212 may provide an interface with the SSD 2200 in correspondence to the protocol of the host device 2100. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI) and PCI express (PCI-E) protocols. In addition, the host interface unit 2212 may perform a disk emulating function of supporting the host device 2100 to recognize the SSD 2200 as a hard disk drive (HDD).

The ECC unit 2213 may generate parity bits based on the data transmitted to the nonvolatile memory devices 2231 to 223n. The generated parity bits may be stored along with data in the nonvolatile memory devices 2231 to 223n. The ECC unit 2213 may detect an error of the data read from the nonvolatile memory devices 2231 to 223n. When the detected error is within a correctable range, the ECC unit 2213 may correct the detected error.

The control unit 2214 may analyze and process the signal SGL inputted from the host device 2100. The control unit 2214 may control the operations of the buffer memory device 2220 and the nonvolatile memory devices 2231 to 223n according to a firmware or a software for driving the SSD 2200.

The random access memory 2215 may be used as a working memory for driving the firmware or the software.

Figure 12:
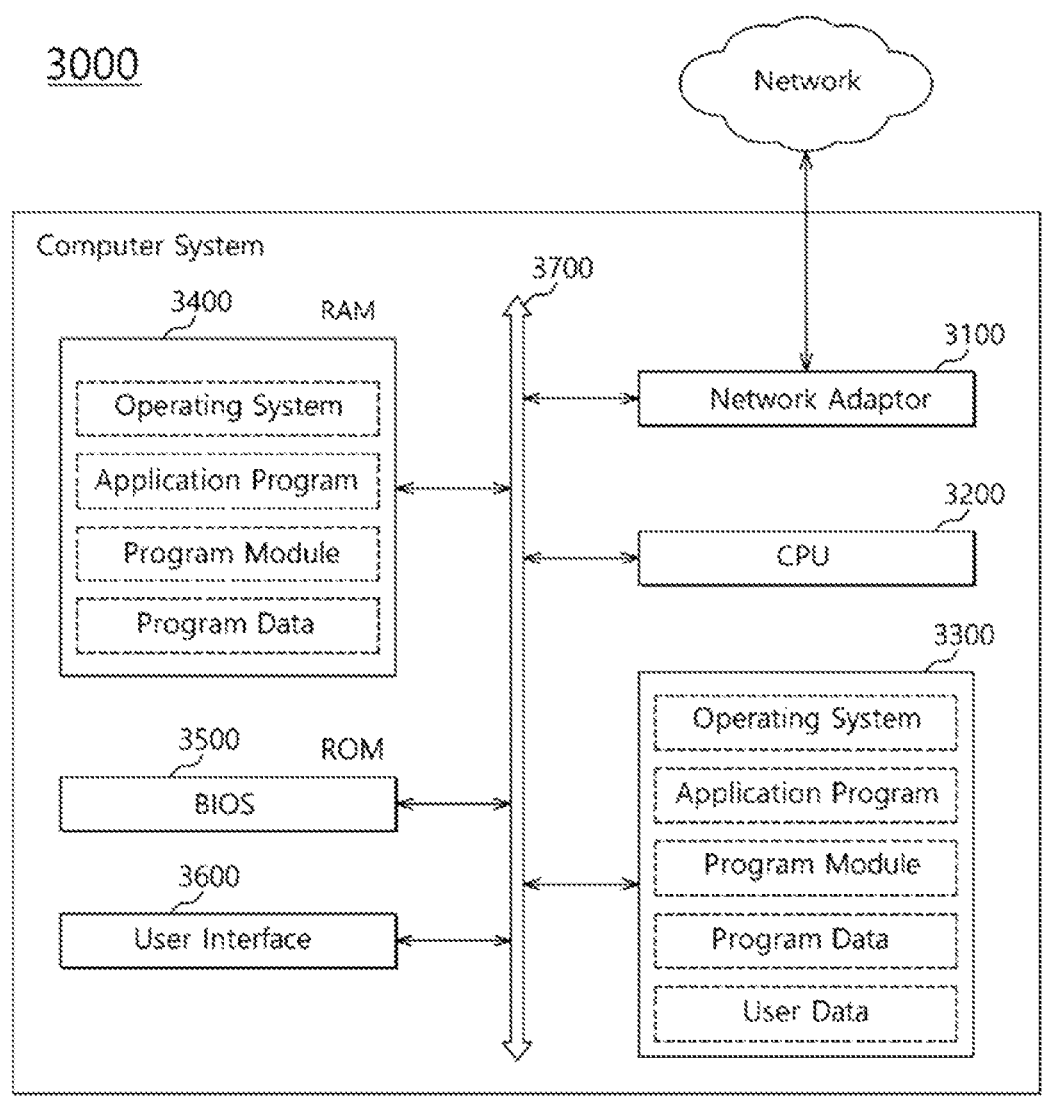
FIG. 12 is a block diagram illustrating a computer system having mounted therein a data storage device according to an embodiment of the invention.

FIG. 12 is a block diagram illustrating an example of a computer system 3000 having mounted therein a data storage device 3300. The computer system 3000 may further include a network adaptor 3100, a central processing unit 3200, a RAM 3400, a ROM 3500 and a user interface 3600, which may be electrically coupled to a system bus 3700. The data storage device 3300 may be constructed having any of the features of the data storage device 100, 1200 or 2200 described earlier herein in reference to FIG. 1, 9, or 10, respectively. The network adaptor 3100 may provide interfacing between the computer system 3000 and one or more external networks. The central processing unit 3200 may perform any general operations as may be needed, for example, for driving an operating system residing at the RAM 3400 or an application program.

The data storage device 3300 may store general data that may be needed, for example, for the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program any data required for driving programs, which may be read from the data storage device 3300, may be loaded on the RAM 3400. A BIOS (basic input/output system) which may activated before the operating system is driven, may be stored in the ROM 3500. Information exchange between the computer system 3000 and a user may be implemented, for example, through the user interface 3600.

While the present invention has been described in relation to various embodiments and examples, it should be understood that the embodiments, and examples are provided for explanation only and are not intended to limit the scope of the invention in any way as defined by the appended claims.

What is claimed is:

1. A data storage device comprising:
a nonvolatile memory device including a memory cell array having one or more data cells and one or more flag cells, the flag cells being suitable for storing information denoting whether a most significant bit (MSB) data is programmed in the corresponding data cells; and
a controller suitable for controlling the nonvolatile memory device to adjust a read voltage for the flag cells, in the case where recovery is made from a power failure to a normal state,
wherein the controller controls the nonvolatile memory device to adjust the read voltage for the flag cells when a last programmed page at the power failure is an MSB page for storing the MSB data, and
wherein the nonvolatile memory device adjusts the read voltage for the flag cells according to the control of the controller, and determines whether a program operation to the MSB page is completed based on data read from the flag cells using the adjusted read voltage for the flag cells.

2. The data storage device according to claim 1, wherein the nonvolatile memory device determines whether the flag cells are on-cells or off-cells based on data read from the flag cells, determines that the program operation to the MSB page is completed when the flag cells are the off-cells, and reads the MSB data from the MSB page.

3. The data storage device according to claim 1, wherein the controller provides a command for adjusting the read voltage for flag cells, to the nonvolatile memory device.

4. The data storage device according to claim 1, wherein the controller determines a level of the read voltage for flag cells, and provides the determined level of the read voltage for flag cells, to the nonvolatile memory device.

5. The data storage device according to claim 1, wherein the controller controls the nonvolatile memory device to adjust the read voltage such that adjusted read voltage is higher than original read voltage.

6. The data storage device according to claim 1, wherein the controller adjusts the read voltage only for those flag cells corresponding to the data cells having the MSB data stored therein.

7. The data storage device according to claim 1, the controller comprising a control unit and a random access memory, the random access memory comprising a power failure recovery module (PFR), wherein said power failure recovery module is suitable for detecting a power failure, searching and detecting the last programmed page, determining whether the last programmed page is the MSB page, and adjusting the read voltage of the flag cells only if the corresponding page is the MSB page to enable reading of the last programmed page.

8. The data storage device according to claim 1, wherein said controller further comprises a control unit and a random access memory, the random access memory comprising a power failure module, a garbage collection module, an address mapping table, a wear levelling module and a bad block management module.

9. A method for operating a data storage device, which includes a nonvolatile memory device including a memory cell array having one or more data cells and one or more flag cells, each of which is suitable for storing information representing whether a most significant bit (MSB) data is programmed in the corresponding data cells, the method comprising:
searching a last programmed page at power failure after power failure recovery;
determining whether the last programmed page is an MSB page for storing the MSB data;
adjusting a read voltage for one of the flag cells, one of pages corresponding to which is determined as the MSB page; and
determining whether a program operation to the MSB page is completed based on data read from the flag cell using the adjusted read voltage for the flag cell.

10. The method according to claim 9, wherein said adjusting is performed when the last programmed page is the page determined as the MSB page as a result of the determination.

11. The method according to claim 9, wherein the determining whether the program operation to the MSB page is operation comprises:
determining whether the flag cell is an on-cell or an off-cell based on the data read from the flag cell; and
determining that the program operation to the MSB page is completed when the flag cell is the off-cell.

12. The method according to claim 10, further comprising:
wherein the adjusting is performed to one of the flag cell groups, one of the pages corresponding to which is determined as the MSB page according to original read voltage before the adjusting, and
wherein the reading of the last programmed page after the adjusting is performed when one of the flag cell groups corresponding to the last programmed page is determined to represent that the last programmed page is the MSB page according to adjusted read voltage by the adjusting.

13. The method according to claim 9, wherein said adjusting is performed by providing a voltage adjustment command to the nonvolatile memory device.

14. The method according to claim 9, wherein said adjusting comprises determining a level of the read voltage and providing the nonvolatile memory device with the determined level of the read voltage.

15. The method according to claim 9, wherein the adjusting is performed such that adjusted read voltage is higher than original read voltage.

16. The method according to claim 11, further comprising reading the last programmed page after the determining that the program operation to the MSB page is completed.

17. The method according to claim 9, wherein the adjusting is performed such that adjusted read voltage for the flag cell group is the same as a highest read voltage for the pages.

18. The method according to claim 9, wherein said searching comprises:
reading the pages in order of program operations to the pages;
determining earliest erased page, which is first one of erased pages in the pages in order of program operation to the pages; and
determining a page programmed immediately prior to the earliest erased page to be the last programmed page.

* * * * *